United States Patent
Li et al.

(10) Patent No.: US 6,953,601 B2
(45) Date of Patent: Oct. 11, 2005

(54) SYNTHETIC FREE LAYER FOR CPP GMR

(75) Inventors: Min Li, Fremont, CA (US); Simon Liao, Fremont, CA (US); Kochan Ju, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 532 days.

(21) Appl. No.: 10/167,859

(22) Filed: Jun. 11, 2002

(65) Prior Publication Data

US 2003/0227724 A1 Dec. 11, 2003

(51) Int. Cl.$^7$ ............................... B05D 5/00; G11B 5/127
(52) U.S. Cl. .................. 427/131; 427/132; 360/324.12
(58) Field of Search .................. 427/127, 128, 427/131, 132, 404, 419.1; 360/110, 313, 324, 119, 120, 121, 324.1, 324.12

(56) References Cited

U.S. PATENT DOCUMENTS

| | | | |
|---|---|---|---|
| 5,446,613 A | 8/1995 | Rottmayer | 360/113 |
| 5,627,704 A | 5/1997 | Lederman et al. | 360/113 |
| 5,657,191 A | 8/1997 | Yuan | 360/113 |
| 5,668,688 A | 9/1997 | Dykes et al. | 360/113 |
| 5,883,763 A | 3/1999 | Yuan et al. | 360/113 |
| 6,002,553 A | 12/1999 | Stearns et al. | 360/113 |
| 6,055,136 A * | 4/2000 | Gill et al. | 360/314 |
| 6,134,089 A | 10/2000 | Barr et al. | 360/322 |
| 6,621,667 B1 * | 9/2003 | He et al. | 360/324.12 |
| 6,704,175 B2 * | 3/2004 | Li et al. | 360/324.11 |
| 6,759,081 B2 * | 7/2004 | Huganen et al. | 427/58 |
| 2002/0041473 A1 * | 4/2002 | Hoshiya et al. | 360/324.11 |

* cited by examiner

Primary Examiner—Timothy Meeks
Assistant Examiner—William Phillip Fletcher, III
(74) Attorney, Agent, or Firm—George O. Saile; Stephen B. Ackerman

(57) ABSTRACT

Reduction of the free layer thickness in GMR devices is desirable in order to meet higher signal requirements, besides improving the GMR ratio itself. However, thinning of the free layer reduces the GMR ratio and leads to poor thermal stability. This problem has been overcome by making AP2 from an inverse GMR material and by changing the free layer from a single uniform layer to a ferromagnetic layer AFM (antiferromagnetically) coupled to a layer of inverse GMR material. Examples of alloys that may be used for the inverse GMR materials include FeCr, NiFeCr, NiCr, CoCr, CoFeCr, and CoFeV. Additionally, the ruthenium layer normally used to effect antiferromagnetic coupling can be replaced by a layer of chromium. A process to manufacture the structure is also described.

12 Claims, 1 Drawing Sheet

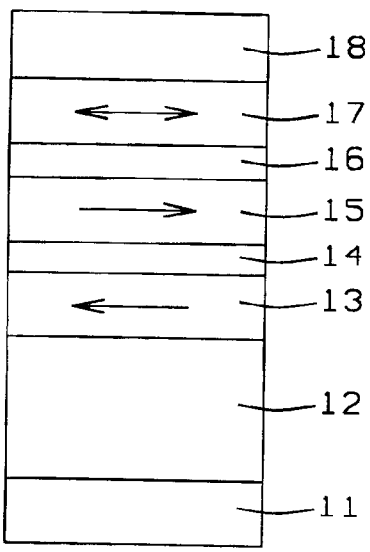
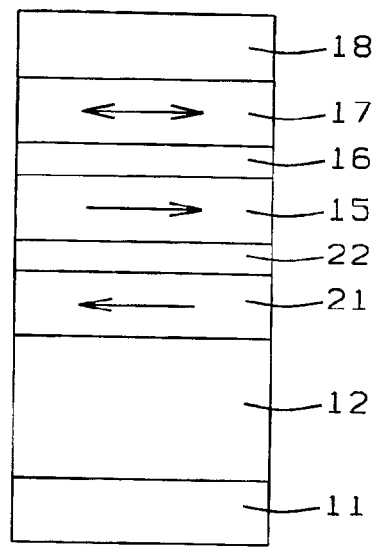
FIG. 1 - Prior Art
FIG. 2
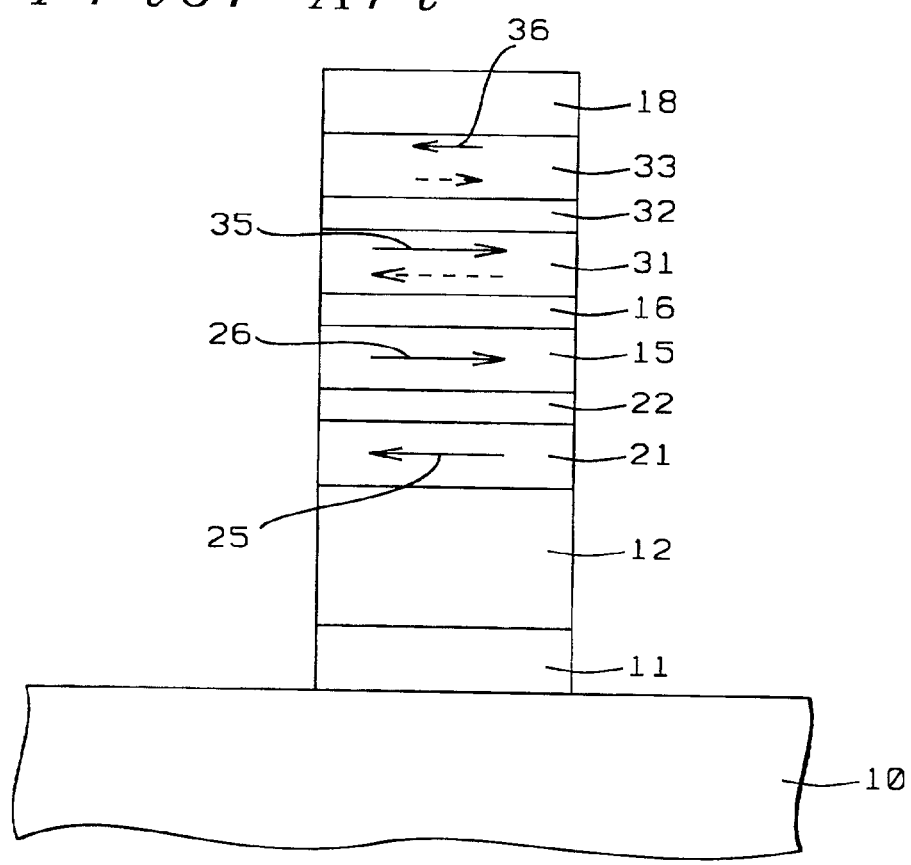
FIG. 3

SYNTHETIC FREE LAYER FOR CPP GMR

FIELD OF THE INVENTION

The invention relates to the general field of magnetic storage devices with particular reference to GMR based read heads and their free layers.

BACKGROUND OF THE INVENTION

The principle governing the operation of most current magnetic read heads is the change of resistivity of certain materials in the presence of a magnetic field (mag-neto-resistance or MR). Magneto-resistance can be significantly increased by means of a structure known as a spin valve or SV. The resulting increase (known as Giant Magneto-Resistance or GMR) derives from the fact that electrons in a magnetized solid are subject to significantly less scattering by the lattice when their own magnetization vectors (due to spin) are parallel (as opposed to anti-parallel) to the direction of magnetization of their environment.

The key elements of a spin valve are a low coercivity (free) ferromagnetic layer, a non-magnetic spacer layer, and a high coercivity ferromagnetic layer. The latter is usually formed out of a soft ferromagnetic layer that is pinned magnetically by a nearby layer of antiferromagnetic material. Alternatively, a synthetic antiferromagnet (formed by sandwiching an antiferromagnetic coupling layer between two antiparallel ferromagnetic layers) may be used as the pinned layer. This results in a more stable device which we will refer to it as a synthetically pinned device.

When the free layer is exposed to an external magnetic field, the direction of its magnetization is free to rotate according to the direction of the external field. After the external field is removed, the magnetization of the free layer will stay at a direction, which is dictated by the minimum energy state, determined by the crystalline and shape anisotropy, current field, coupling field and demagnetization field. If the direction of the pinned field is parallel to the free layer, electrons passing between the free and pinned layers, suffer less scattering. Thus, the resistance at this state is lower. If, however, the magnetization of the pinned layer is anti-parallel to that of the free layer, electrons moving from one layer into the other will suffer more scattering so the resistance of the structure will increase. The change in the resistance of a spin valve is typically 10–20% when current flow is in the film plane.

Most GMR devices have been designed so as to measure the resistance of the free layer for current flowing parallel to the film's plane. However, as the quest for ever greater densities continues, devices that measure current flowing perpendicular to the plane (CPP) have begun to emerge. For devices depending on in-plane current, the signal strength is diluted by parallel currents flowing through the other layers of the GMR stack, so these layers should have resistivities as high as possible while the resistance of the leads into and out of the device need not be particularly low. By contrast, in a CPP device, the resistivity of both the leads and the other GMR stack layers should be as low as possible.

As shown in FIG. 1, the CPP spin valve structure has three magnetic layers: free layer 17 as well as AP1 layer 15, and AP2 layer 13. Free layer 17 is free to rotate in response to external fields. The AP2 direction is fixed by antiferromagnetic layer 12 (typically MnPt) with ruthenium layer 14 being used to provide the antiferromagnetic coupling. Their relative magnetization directions during device operation are always antiparallel to one other. It is normal practice to utilize the same material (like CoFe) for both AP1 and AP2. This has a positive bulk spin asymmetry coefficient $\beta$, as well as positive interface spin asymmetry coefficient $\gamma$.

$\beta$ is defined as $1-\rho\uparrow/(2\rho)=\rho\downarrow/(2\rho)-1$ where $\rho\uparrow$, $\rho\downarrow$ are the resistivity of spin up and spin down electrons, respectively. $\rho$ is the material resistivity ($=\rho\uparrow\rho\downarrow/\rho\uparrow+\rho\downarrow$). $\gamma$ is defined as $1-r\uparrow/2r_b)=r\downarrow/(r\uparrow+r\downarrow)$ where $r\uparrow(r\downarrow)$ is the interface resistance for spin up and spin down electrons; $r_b=(r\uparrow r\downarrow)/r\uparrow+r\downarrow)$. When $r\uparrow=r\downarrow$, $\gamma$ will be 0 and the interface has no spin dependent scattering. Also seen in FIG. 1 is seed layer 11, capping layer 18 and non-magnetic spacer layer 16.

In TABLE 1 we show the $\beta$ and $\gamma$ magnitudes for the three magnetic layers together with the resulting magnitude of their resistivity for both up and down electrons for both the parallel and antiparallel states:

TABLE I (Ru between AP1 and AP2)

| LAYER | $\beta$ | $\gamma$ | resistivity in P state | | resistivity in AP state | |
|---|---|---|---|---|---|---|
| | | | spin up | spin down | spin up | spin down |
| CoFe (free) | >0 | >0 | low | high | high | low |
| CoFe (AP1) | >0 | >0 | low | high | low | high |
| CoFe (AP2) | >0 | >0 | high | low | high | low |

The consequences of this are that the AP2 contribution to CPP GMR is always negative so it reduces the resistance contrast between the parallel and anti-parallel states of the free layer. This limits the GMR ratio as well as dRA (change in anti-parallel resistance) for synthetically pinned spin valves.

In order to meet higher signal requirements it would be desirable to reduce the thickness of the free layer besides improving the GMR ratio itself. However, thinning of the free layer causes a low GMR ratio and poor thermal stability. A synthetic free layer would seem to provide a way to maintain good thermal stability but, in both in CIP and CPP SV structures, synthetic free layers actually cause a GMR loss due to current shunting in CIP and effective thinning of the free layer in CPP.

The present invention discloses a solution to this problem.

A routine search of the prior art was performed with the following references of interest being found:

In U.S. Pat. No. 5,627,704, Lederman et al. show a MR CCP transducer structure. Dykes et al. (U.S. Pat. No. 5,668,688) shows a CPP SV MR device. U.S. Pat. No. 6,134,089 (Barr et al.) also describes a CPP MR device. U.S. Pat. No. 5,883,763 (Yuan) discloses a CPP GMR Transducer while in U.S. Pat. No. 5,657,191 Yaun teaches how to stabilize a MR device. U.S. Pat. No. 6,002,553 (Stearns et al.) and U.S. Pat. No. 5,446,613 (Rottmayer) also are related patents.

SUMMARY OF THE INVENTION

It has been an object of at least one embodiment of the present invention to provide a Current Perpendicular to Plane Spin Valve (CPP SV) for use as a read head in a magnetic information storage system.

Another object of at least one embodiment of the present invention has been that the pinned layer of said CPP SV be synthetically pinned.

A further object of at least one embodiment of the present invention has been that the free layer of said CPP SV comprise a ferromagnetic layer that is AFM coupled to an inverse GMR layer, whereby the, active thickness of said free layer is increased.

Still another object of at least one embodiment of the present invention has been to provide a process for manufacturing said CPP SV.

These objects have been achieved by making AP2 (the antiparallel layer that contacts the antiferromagnetic layer) from an inverse GMR material and by changing the free layer from a single uniform layer to a ferromagnetic layer AFM (antiferromagnetically) coupled to a layer of inverse GMR material. Examples of alloys that may be used for the bp inverse GMR materials include FeCt, NiFeCr, NiCr, CoCr, CoFeCr, and CoFeV. Additionally, the ruthenium layer normally used to effect antiferromagnetic coupling is replaced by a layer of chromium.

BRIEF DESCRIPTION OF THE DRAWINGS

FIG. 1 is a cross-sectional view of a synthetically pinned CPP SV of the prior art.

FIG. 2 is a cross-sectional view of a synthetically pinned CPP SV in which a ferromagnetic material is AFM coupled to a layer of inverse GMR material through a layer of chromium.

FIG. 3 is a cross-sectional view of a synthetically pinned CPP SV having a free layer that is formed through AFM coupling of a ferromagnetic layer to an inverse GMR layer.

DESCRIPTION OF THE PREFERRED EMBODIMENTS

In current synthetically pinned CPP SVs, AP2 has the same sign (positive) for both the bulk and interface scattering coefficient ($\beta$ and $\gamma$ respectively) as AP1 and it therefore always reduces the CPP GMR. It has been found that certain magnetic material such as FeCr, NiFeCr, CoFeCr, and CoFeV have negative values of $\beta$, i.e. spin up electrons undergo more scattering than spin down electrons. It has also been found that the material/Cr interface for most magnetic materials also exhibits negative $\gamma$, i.e. spin up electrons undergo more scattering at this interface than spin down electrons). This has been summarized in TABLE II below:

TABLE II (Cr between AP1 and AP2)

| | | | resistivity in P state | | resistivity in AP state | |
|---|---|---|---|---|---|---|
| LAYER | β | γ | spin up | spin down | spin up | spin down |
| CoFe (free) | >0 | >0 | low | high | high | low |
| CoFe (AP1) | >0 | >0 | low | high | low | high |
| FeCr (AP2) | <0 | <0 | low | high | low | high |

Thus a FeCr/Cr type bilayer usually has an inverse GMR effect relative to CoFe/Ru type bilayers. We therefore refer to materials of this type as inverse GMR materials. The present invention discloses the use of inverse GMR materials in AP2, which enables CPP GMR, as well as dRA, to be greatly enhanced.

In U.S. Pat. No. 6,683,762 B2, a method to enhance CPP GMR (both dRA and GMR) by using inverse GMR materials in AP2 such as FeCr etc. is disclosed and is incorporated herein by reference.

The general structure is shown in FIG. 2 where it can be seen that AP2 13 (of FIG. 1) has been replaced by AP2 21 which is now one of the inverse GMR materials listed above. Additionally, Ru AFM coupling layer 14 of FIG. 1 has been replaced by Cr layer 22 in FIG. 2. The effect of these changes was a noticeable performance improvement for synthetically pinned CPP SVs.

The present invention takes this application of inverse GMR materials a step further by incorporating them into the free layer, as well. Instead of a conventional single uniform layer of a low coercivity ferromagnetic material, the free layer is now a synthetic antiparallel pair of layers, F1 and F2, one of which is an inverse GMR material, with the layers being AFM coupled through a layer of chromium. This is shown in FIG. 3 where F1 31 and F2 33 are coupled through Cr layer 32. For this configuration, TABLE I is now modified to become TABLE III as shown below:

TABLE III (Ru between AP1 and AP2; Cr between F1 and F2)

| | | | resistivity in P state | | resistivity in AP state | |
|---|---|---|---|---|---|---|
| LAYER | β | γ | spin up | spin down | spin up | spin down |
| FeCr (F2) | <0 | <0 | low | high | high | low |
| CoFe (F1) | >0 | >0 | low | high | high | low |
| CoFe (AP1) | >0 | >0 | low | high | low | high |
| CoFe (AP2) | >0 | >0 | high | low | high | low |

The effectiveness of the above configuration was confirmed, as shown by the following data (which was generated through simulation), with numbers indicating thickness in Angstroms:
Seed/MnPt200/CoFe20/Ru8/CoFe30/Cu20/Cofe30/cap—conventional single free layer
  dRA=0.66 mohm/$\mu$m$^2$ RA=78.5 mohm/$\mu$m$^2$ GMR=0.8%
Seed/MnPt200/CoFe20/Ru8/CoFe30/Cu20/CoFe50/Ru/CoFe20/cap—conventional synthetic frece layer
  dRA=0.5mohm/$\mu$m$^2$ RA=83 mohm/$\mu$m$^2$ GMR=0.6%
Seed/MnPt200/CoFe20/Ru8/CoFe30/Cu20/CoFe50/Cr10/FeCr50/cap—inverse GMR free layer (invention)
  dRA=0.9mohm/$\mu$m$^2$ RA=86mohm/$\mu$m$^2$ GMR=1%

The notion of a free layer using inverse GMR materials may be taken a step further by combining it with the structure described in TABLE II:

TABLE IV (Cr or Ru between AP1 and AP2; Cr or Ru between F1 and F2)

| | | | resistivity in P state | | resistivity in AP state | |
|---|---|---|---|---|---|---|
| LAYER | β | γ | spin up | spin down | spin up | spin down |
| FeCr (F2) | <0 | <0 | low | high | high | low |
| CoFe (F1) | >0 | >0 | low | high | high | low |
| CoFe (AP1) | >0 | >0 | low | high | low | high |
| FeCr (AP2) | <0 | <0 | low | high | low | high |

Results for this configuration were as follows:
Seed/MnPt200/FeCr50/Cr10/CoFe30/Cu20/CoFe5O/Cr10/FeCr50/cap
  dRA=2.1 mohm/$\mu$m$^2$ RA=90mohm/$\mu$m$^2$ GMR=2.5%

Thus, structures based on the configuration summarized in TABLE IV, are seen to exhibit an improvement of about 230% in dRA relative to the prior art.

We now provide a description of a process for manufacturing these structures. As this unfolds, further details concerning the structures of the present invention will also become clear.

The process of the present invention begins, as illustrated in FIG. 3, with the provision of substrate 10 onto which is deposited seed layer 11. Then, layer of antiferromagnetic material 12 (for example MnPt, NiMn, or IrMn) is deposited on seed layer 11, followed by the deposition of layer 21. This is a layer of an inverse GMR material such as, but not limited to, FeCr, NiFeCr, CoCr, CoFeCr, CoFeV, FeV, and CoV, which is deposited to a thickness between about 10 and 70 Angstroms.

Next, chromium or ruthenium layer 22 is deposited onto layer 21 (to a thickness between about 5 and 15 Angstroms for Cr and between about 6 and 9 Angstroms for Ru) following which layer 15, which could be any of (though not limited to) CoFe, CoNiFe, CoNi, and Co, is laid down. The thickness of layer 15 is between about 20 and 50 Angstroms.

Copper spacer layer 16 is then deposited onto layer 15. This is followed by a key novel step which is the deposition of layer 31, the first of a pair of low coercivity layers, onto copper spacer layer 16. Layer 31 could be any of, though is not limited to, CoFe, CoNiFe, CoNi, NiFe, and Co. It is deposited to a thickness between about 20 and 100 Angstroms. Second chromium or ruthenium layer 32 is now deposited, to a thickness between about 5 and 15 Angstroms (for chromium; between about 6 and 9 Angstroms for ruthenium) onto 31, its purpose being to serve as an antiferromagnetic coupling layer between 31 and layer 33 which is immediately deposited onto it.

As another key feature of the invention, layer 33 is a low coercivity inverse GMR material. It could be any of FeCr, NiFeCr, CoFeCr, CoFeV, and CoV though is not limited to these. It is deposited to a thickness between about 10 and 100 Angstroms. When an external field that is to be sensed by the finished device is (for example) in the same direction as that of layer 15 (arrow 26), layer 31 responds like a conventional free layer by becoming magnetized in direction 35. Since it is AFM coupled to layer 31, layer 33 responds the external field by being magnetized in direction 36 and, since it is an inverse GMR material, its resistivity changes in the same direction as that of layer 31, effectively increasing the thickness of the free layer but without any of the attendant problems discussed earlier.

The process concludes with the deposition of cap layer 18.

What is claimed is:

1. A process to manufacture a synthetically pinned CPP SV magnetic read head, comprising:

providing a substrate and depositing thereon a seed and then depositing a layer of antiferromagnetic material on said seed layer;

on said layer of antiferromagnetic material, depositing a first layer of an inverse GMR material;

depositing a first layer of chromium on said first layer;

on said first layer of chromium, depositing a second layer, of cobalt-iron;

then depositing a copper spacer layer on said second layer;

on said copper spacer layer, depositing a third layer, of low coercivity ferromagnetic material;

on said third layer, depositing a second layer of chromium;

on said second layer of chromium, depositing a fourth layer, of low coercivity inverse GMR material; and then depositing a cap layer on said fourth layer.

2. The process described in claim 1 wherein said antiferromagnetic layer is selected from the group consisting of MnPt, NiMn, and IrMn.

3. The process described in claim 1 wherein said layer first layer of inverse GMR material is selected from the group consisting of FeCr, CoFeCr, NiFeCr, CoCr, CoFeV, FeV, and CoV.

4. The process described in claim 1 wherein said first layer of inverse GMR material is deposited to a thickness between about 10 and 70 Angstroms.

5. The process described in claim 1 wherein said first layer of chromium is deposited to a thickness between about 5 and 15 Angstroms.

6. The process described in claim 1 wherein said second layer ferromagnetic material is selected from the group consisting of CoFe, Co, CoFeNi, CoNi, and NiFe.

7. The process described in claim 1 wherein said second layer ferromagnetic material is deposited to a thickness between about 20 and 50 Angstroms.

8. The process described in claim 1 wherein said third layer of low coercivity ferromagnetic material is selected from the group consisting of CoFe, Co, CoFeNi, CoNi, and NiFe.

9. The process described in claim 1 wherein said third layer of low coercivity ferromagnetic material is deposited to a thickness between about 20 and 100 Angstroms.

10. The process described in claim 1 wherein said second layer of chromium is deposited to a thickness between about 5 and 15 Angstroms.

11. The process described in claim 1 wherein said fourth layer, of low coercivity inverse GMR material, is selected from the group consisting of FeCr, CoFeCr, NiFeCr, CoCr, CoFeV, FeV, and CoV.

12. The process described in claim 1 wherein said fourth layer, of low coercivity inverse GMR material, is deposited to a thickness between about 10 and 100 Angstroms.

* * * * *